(12) United States Patent
Tanigawa et al.

(10) Patent No.: US 7,361,432 B2
(45) Date of Patent: Apr. 22, 2008

(54) COMPOSITION FOR HOLOGRAM-RECORDING MATERIAL, HOLOGRAM-RECORDING MEDIUM, AND PROCESS FOR PRODUCING THE SAME

(75) Inventors: Hideo Tanigawa, 8-28, Eushiodai 3-chome, Ikeda-shi, Osaka (JP); Yasuo Matoba, Osaka (JP); Tetsuyuki Saika, Osaka (JP); Takashi Matsuo, Osaka (JP); Kazunori Yokoyama, Osaka (JP)

(73) Assignees: National Institute of Advanced Industrial Science and Technology, Tokyo (JP); Hideo Tanigawa, Osaka (JP); Daiso, Co., Ltd., Osaka (JP)

( * ) Notice: Subject to any disclaimer, the term of this patent is extended or adjusted under 35 U.S.C. 154(b) by 426 days.

(21) Appl. No.: 10/470,771

(22) PCT Filed: Jan. 30, 2002

(86) PCT No.: PCT/JP02/00681

§ 371 (c)(1),
(2), (4) Date: Dec. 10, 2003

(87) PCT Pub. No.: WO02/061508

PCT Pub. Date: Aug. 8, 2002

(65) Prior Publication Data

US 2004/0096776 A1 May 20, 2004

(30) Foreign Application Priority Data

Feb. 1, 2001 (JP) ............................. 2001-025122
Jul. 19, 2001 (JP) ............................. 2001-219594

(51) Int. Cl.
*G03H 1/02* (2006.01)
(52) U.S. Cl. .................................. 430/1; 430/2; 359/3
(58) Field of Classification Search ............... None
See application file for complete search history.

(56) References Cited

U.S. PATENT DOCUMENTS 3,658,526 A 4/1972 Haugh (Continued)

FOREIGN PATENT DOCUMENTS

JP 04-351674 * 12/1992

(Continued)

OTHER PUBLICATIONS

Chemical structures (generated Dec. 2007) (8 pages).*

(Continued)

*Primary Examiner*—Martin Angebranndt
(74) *Attorney, Agent, or Firm*—Cheng Law Group PLLC (57) ABSTRACT

An object of the present invention is to provide a hologram recording material composition comprising a radical polymerizable compound being solid at an ordinary temperature and having a 9,9-diarylflourene skeleton, a polymeric binder and a plasticizer, the composition being excellent in transparency and diffraction efficiency, which are characteristics required for a hologram.

The hologram recording material composition comprises a thermoplastic resin (A) which is soluble in a solvent, a radical polymerizable compound (B) which is solid at an ordinary temperature and at ordinary pressure and has the 9,9-diarylfluorene skeleton and at least one radical polymerizable unsaturated double bond, a plasticizer (C) and a photopolymerization initiator (D). A weight percentage ratio of the thermoplastic resin (A), the radical polymerizable compound (B) and the plasticizer (C), (A):(B):(C) is 10 to 80:10 to 80:10 to 80. A refractive index of the radical polymerizable compound (B) is larger than a weighted mean of that of the thermoplastic resin (A) and that of the plasticizer (C).

6 Claims, 1 Drawing Sheet

U.S. PATENT DOCUMENTS

| | | | |
|---|---|---|---|
| 3,993,485 | A | 11/1976 | Chandross et al. |
| 4,942,102 | A | 7/1990 | Keys et al. |
| 4,942,112 | A | 7/1990 | Monroe et al. |
| 5,858,614 | A | 1/1999 | Sato et al. |

FOREIGN PATENT DOCUMENTS

| | | | |
|---|---|---|---|
| JP | 06-301322 | A1 | 10/1994 |
| JP | 08-101502 | A1 | 4/1996 |
| JP | 11-217311 | * | 8/1999 |
| JP | 2000-178114 | * | 6/2000 |
| JP | 2001-056631 | A1 | 2/2001 |
| JP | 2001-109360 | A1 | 4/2001 |
| JP | 2001-125474 | A1 | 5/2001 |
| JP | 2001-282082 | A1 | 10/2001 |

OTHER PUBLICATIONS

International Search Report for PCT/JP02/00681 mailed on May 21, 2002.

Display Holography Handbook, p. 66 to 67 (Gyoin Shokan, 1985).

Optical Engineering Handbook, p. 351 to 353 (Asakura Shoten, 1986).

Multicomponent photopolymer systems for volume phase holograms and grating devices, W.J. Tomlinson et al., Applied Optics/vol. 15, No. 2/Feb. 1976.

European Search Report mailed Jul. 5, 2006.

* cited by examiner

COMPOSITION FOR HOLOGRAM-RECORDING MATERIAL, HOLOGRAM-RECORDING MEDIUM, AND PROCESS FOR PRODUCING THE SAME

TECHNICAL FIELD

The present invention relates to a novel volume phase-type hologram recording material composition to be used for recording intensity distribution of light and shade of a light interference pattern as a change in refractive index, and particularly a hologram recording material composition for producing a recording medium which is excellent in transparency and diffraction efficiency, which are fundamental characteristics required for a hologram, and it also relates to a hologram recording medium obtained therefrom and a process for producing the same.

BACKGROUND ART

A hologram is a record of an interference fringe of coherent laser light on a photosensitive material, and is used in various field, such as an optical device, a three-dimensional display, interferometry and processing of an image and information, owing to the multi-functionality thereof.

As a representative example of the conventional hologram recording material composition, a gelatin dichromate photosensitive material and a breached silver salt photosensitive material (described, for example, in *Display Holography Handbook*, p. 66 to 67 (Gyoin Shokan, 1985) and *Optical Engineering Handbook*, p. 351 to 353 (Asakura Shoten, 1986)).

However, although gelatin dichromate has a high diffraction efficiency, and a silver salt photosensitive material has a high sensitivity, these materials require a complicated process on production of a hologram, and particularly they have a problem in that they require a wet development process.

As a photosensitive material to eliminate the problem, a hologram recording material composition containing a photo-polymerizable monomer is proposed. In this material, a photo-polymerizable monomer is polymerized in a portion having a large light amount in the interference fringe to cause a refractive index modulation in that portion, and thus a hologram is recorded. Examples thereof include a photo-polymerization type recording material mainly comprising cyclohexyl methacrylate and N-vinylcarbazole as photopolymerizable monomers; and a photo-polymerization initiator, and a photo-polymerization type recording material mainly comprising butyl methacrylate and ethylene glycol dimethacrylate as photopolymerizable monomers, and 1-phenylnaphthalene as an inactive component not participating in the polymerization; and a photo-polymerization initiator (as described in *Appl. Opt.*, vol. 15, p. 534 (1976), U.S. Pat. No. 3,993,485 and the like).

However, because these materials are in a liquid state, the composition flows between two surface materials on recording a hologram to prevent recording in good conditions. Furthermore, an unreacted monomer remains after recording the hologram in a portion of a small light amount, and therefore the record is necessarily stabilized by conducting an exposure treatment on the whole surface.

In order to solve the above-mentioned problems of the prior arts, it is proposed that a polymer which does not participate in photoreaction is used as a binder in order to inhibit fluidization of compositions, and the polymer is used in combination with a photopolymerizable monomer which is liquid at an ordinary temperature (U.S. Pat. No. 3,658,526). These compositions do not require treatment such as heating before and after recording holograms and can prepare the holograms only by simple dry treatment. However, this technique is inferior to the above-mentioned gelatin dichromate and silver salt photosensitive material in diffraction efficiency, which represents essential performance of the holograms.

As improvement of the above-mentioned prior art, compositions consisting essentially of a binder polymer, a liquid photopolymerizable monomer having a high refractive index, a plasticizer and a photopolymerization initiator, the photopolymerizable monomer containing an atom which contributes to the high refractive index such as chlorine or bromine in order to improve refractive modulation are proposed (U.S. Pat. Nos. 4,942,102 and 4,942,112 and the like). In the case of these compositions, compatibility with the plasticizer was often poor, and there were problems such as insufficient solubility of the compositions, haze and the like. Since recorded holograms had insufficient diffraction efficiency, it was necessary to perform heat treatment or the like after recording again to amplify the diffraction efficiency, and post-treatment was still troublesome.

As improvement of the above-mentioned prior art, compositions comprising a polymeric binder, a radical polymerizable compound having a 9,9-diarylfluorene skeleton and being liquid at an ordinary temperature, a plasticizer and a photopolymerization initiator are proposed (Japanese Laid-open Patent Publication No. 301322/1994). The publication discloses that since the radical polymerizable compound does not contain chlorine, bromine or the like and has the 9,9-diarylfluorene skeleton in order to increase a refractive index, the compound is compatible with components such as the binder polymer.

However, there existed the problem that since the compound is liquid at an ordinary temperature and has a lower refractive index than a monomer which is solid at an ordinary temperature, sufficient diffraction efficiency is not obtained in holograms after recording. Accordingly, a combination of the monomer having a higher refractive index and being solid at an ordinary temperature with the polymeric binder was desired. However, there existed the problem that when the monomer which is solid at an ordinary temperature is used, the photosensitive material causes haze, and sufficient optical transmission is not obtained.

DISCLOSURE OF THE INVENTION

An object of the present invention is to provide a hologram recording material composition comprising a radical polymerizable compound being solid at an ordinary temperature and having a 9,9-diarylfluorene skeleton, a polymeric binder, a plasticizer and a photopolymerization initiator, the composition being excellent in transparency and diffraction efficiency, which are characteristics required for a hologram.

As a result of earnest investigations to attain the object described above by the inventors, a novel hologram recording material composition has been developed to complete the invention.

Namely, the present invention relates to a volume phase-type hologram recording material composition to be used for recording intensity distribution of light and shade of an interference pattern obtained by making light interfere as a change in refractive index, characterized in that the composition comprises a thermoplastic resin (A) which is soluble in an organic solvent, a radical polymerizable compound (B) which is solid at an ordinary temperature and at ordinary pressure and has the 9,9-diarylfluorene skeleton and at least one radical polymerizable unsaturated double bond, a plasticizer (C) and a photopolymerization initiator (D), a weight percentage ratio of the thermoplastic resin (A), the radical polymerizable compound (B) and the plasticizer (C), (A):(B):(C) is 10 to 80:10 to 80:10 to 80, and a refractive index of the radical polymerizable compound (B) is larger than a weighted mean of that of the thermoplastic resin (A) and that of the plasticizer (C).

Weight-average molecular weight of the thermoplastic resin (A) is preferably 10,000 to 5,000,000 in order to obtain good processing characteristics.

The thermoplastic resins (A) to be used in the present invention can be any resins which are compatible with the radical polymerizable compound (B) and the plasticizer (C) and can be dissolved in an organic solvent completely without an insoluble matter. A typical thermoplastic resin is selected from the group consisting of homopolymers of a monomer having an ethylenic unsaturated double bond, copolymers of the monomer and a copolymerizable monomer which can be copolymerized with the monomer, condensation polymerization products of a diphenol compound and a dicarboxylic acid compound, polymers having a carbonate group in a molecule thereof, polymers having an —$SO_2$— group in a molecule thereof, cellulose derivatives and combinations thereof.

Specific examples of thermoplastic resins (A) are polyvinyl acetate, polyvinyl butyrate, polyvinyl formal, polyvinyl carbazole, polyacrylic acid, polymethacrylic acid, polymethyl acrylate, polymethyl methacrylate, polyethyl acrylate, polybutyl acrylate, polymethacrylonitrile, polyethyl methacrylate, polybutyl methacrylate, polyacrylonitrile, poly-1,2-dichloroethylene, ethylene-vinyl acetate copolymers, syndiotactic polymethyl methacrylate, poly-α-vinyl naphthalate, polycarbonate, cellulose acetate, cellulose triacetate, cellulose acetate butyrate, polystyrene, poly-α-methylstyrene, poly-o-methylstyrene, poly-p-methylstyrene, poly-p-phenylstyrene, poly-2,5-dichlorostyrene, poly-p-chlorostyrene, poly-2,5-dichlorostyrene, polyarylate, polysulfone, polyethersulfone, styrene-acrylonitrile copolymers, styrene-divinylbenzene copolymers, styrene-butadiene copolymers, styrene-maleic anhydride copolymers, ABS resins, polyethylene, polyvinyl chloride, polypropylene, polyethylene terephthalate, polyvinyl pyrrolidone, polyvinylidene chloride, hydrogenated styrene-butadiene-styrene copolymers, transparent polyurethane, polytetrafluoroethylene, polyvinylidene fluoride and copolymers of cyclic aliphatic(meth)acrylate and methyl(meth)acrylate.

The above-mentioned examples of thermoplastic resins (A) can be used solely or in combination.

The thermoplastic resins (A) preferably have a glass transition temperature (Tg) of 100° C. or higher.

Various thermoplastic resins (A) can be selected depending on use, application and the like of holograms. Polyvinyl acetate, polyvinyl butyrate, cellulose acetate butyrate, the ethylene-vinyl acetate copolymers, polymethyl methacrylate, polystyrene, polyvinyl formal and the like are preferably used in order to obtain a good film forming property and good optical quality such as diffraction efficiency.

The copolymers of cyclic aliphatic(meth)acrylate and methyl(meth)acrylate are preferable in order to obtain better heat resistance, film forming property and optical quality such as diffraction efficiency.

A copolymerization composition ratio of cyclic aliphatic (meth)acrylate to methyl(meth)acrylate constituting the copolymers of cyclic aliphatic(meth)acrylate and methyl (meth)acrylate to be used in the present invention is preferably 5 to 95:95 to 5, more preferably 10 to 90:90 to 10 expressed in a molar ratio (the ester:the acrylate).

Cyclic aliphatic(meth)acrylate constituting the copolymers of cyclic aliphatic(meth)acrylate and methyl(meth) acrylate can be represented by the following general formula [I], wherein $R^1$ and $R^2$, the same or different, are hydrogen or lower alkyl, "l" is an integer of 0 to 6, "m" is an integer of 2 to 6, "n" is an integer of 1 to 5 which is smaller than "m". Any hydrogen atom(s) in alkylene chains $(CH_2)_l$, $(CH_2)_m$ and $(CH_2)_n$ can be substituted by lower alkyl. Two hydrogen atoms linked to different carbon atoms in the alkylene chain $(CH_2)_m$ can be substituted by both terminals of another alkylene chain having one to eight carbon atoms to form another cycloalkane ring. Any hydrogen atom(s) in this cycloalkane ring can be further substituted by lower alkyl. One of carbon atoms in the alkylene chain $(CH_2)_n$ has hydroxyl, to which (meth)acrylic acid is linked to form an ester linkage, and the broken line (------) is the ester linkage thus formed.

A cyclic aliphatic moiety of cyclic aliphatic(meth)acrylate constituting the copolymers of cyclic aliphatic(meth)acrylate and methyl(meth)acrylate can have a bornyl skeleton, an isobornyl skeleton or a norbornyl skeleton.

Examples of cyclic aliphatic(meth)acrylate constituting the copolymers of cyclic aliphatic(meth)acrylate and methyl (meth)acrylate are bornyl(meth)acrylate, isobornyl(meth) acrylate and norbornyl(meth)acrylate.

Cyclic aliphatic(meth)acrylate can be one kind or two or more kinds. In the latter case, the copolymer is a terpolymer or higher of two or more kinds of cyclic aliphatic(meth) acrylate and methyl(meth)acrylate.

Glass transition temperatures of the copolymers of cyclic aliphatic(meth)acrylate and methyl(meth)acrylate are preferably 130° C. or higher.

The copolymers of cyclic aliphatic(meth)acrylate and methyl(meth)acrylate can be used solely or in combination.

The radical polymerizable compounds (B) to be used in the present invention have the 9,9-diarylfluorene skeleton and at least one radical polymerizable unsaturated double bond and are solid at an ordinary temperature and at ordinary pressure. The solid is a state having an endothermic peak at room temperature or higher, which is due to phase transition from a solid to a liquid in differential thermal analysis.

The radical polymerizable compounds (B) can be represented by the following general formula [II], wherein $R^3$ and $R^4$, the same or different, are monovalent organic groups at least one of which has (meth)acryloyl or (meth)acryloyloxy at its terminal, $M^1$ and $M^2$, the same or different, are divalent organic groups represented by $-(OR)_n-$ (wherein R is lower alkylene which can have hydroxyl, and "n" is an integer of 0 to 2) or single bonds, and $X^1$ and $X^2$, the same or different, are hydrogen or lower alkyl.

The organic group having no (meth)acryloyl or (meth)acryloyloxy in $R^3$ and $R^4$ can be lower alkyl having one to three carbon atoms.

In $-(OR)_n-$ of $M^1$ and $M^2$, a carbon number of the lower alkylene R is preferably one to three, more preferably one or two. When "n" is two, two Rs can be the same or different. Examples of OR are oxymethylene, oxyethylene, oxypropylene, oxybutylene and the like. Examples of $(OR)_2$ are dimethoxy, diethoxy and propoxyethoxy. When the lower alkylene R has hydroxyl, the hydroxyl can exist at any positions of the alkylene, and an example of the alkylene having hydroxyl is (2-hydroxy)propylene.

The organic groups $X^1$ and $X^2$ can be alkyl having one to five carbon atoms such as methyl, ethyl or propyl.

The radical polymerizable compounds (B) are exemplified hereinafter;
9,9-bis(4-(meth)acryloyloxyphenyl)fluorene,
9,9-bis(4-(meth)acryloyloxymethoxyphenyl)fluorene,
9,9-bis[4-(2-(meth)acryloyloxyethoxy)phenyl]fluorene,
9,9-bis[4-(meth)acryloyloxy-3-methylphenyl]fluorene,
9,9-bis[4-(meth)acryloyloxymethoxy-3-methylphenyl]fluorene,
9,9-bis[4-(2-(meth)acryloyloxyethoxy)-3-methylphenyl]fluorene,
9,9-bis(4-(meth)acryloyloxy-3-ethylphenyl)fluorene,
9,9-bis(4-(meth)acryloyloxymethoxy-3-ethylphenyl)fluorene,
9,9-bis[4-(2-(meth)acryloyloxyethoxy)-3-ethylphenyl]fluorene,
9,9-bis[4-(2-(meth)acryloyloxypropoxy)-3-ethylphenyl]fluorene,
9,9-bis[4-(3-(meth)acryloyloxy-2-hydroxy)propoxyphenyl]fluorene,
9,9-bis[4-(3-(meth)acryloyloxy-2-hydroxy)propoxy-3-methylphenyl]fluorene and 9,9-bis{4-[2-(3-acryloyloxy-2-hydroxy-propoxy)-ethoxy]phenyl}fluorene.

The radical polymerizable compounds (B) can be oligomers such as dimers or trimers of the above-mentioned compound.

The above-mentioned exemplified compounds can be used solely or in combination.

It is preferable that both the organic groups $R^3$ and $R^4$ are acryloyl and acryloyloxy, and "n" is an integer of zero to two, the carbon number of the lower alkylene R is one or two in $-(OR)_n-$ of $M^1$ and $M^2$, and $X_1$ and $X_2$ are hydrogen in order to obtain a good film forming property and good optical quality such as diffraction efficiency.

Examples of preferred compounds satisfying the above-mentioned conditions are 9,9-bis[4-(3-acryloyloxy-2-hydroxy)propoxyphenyl]fluorene (produced by Nippon Steel Chemical Co., Ltd., "acrylic acid adduct of 9,9-bis(4-hydroxyphenyl)fluorene glycidyl ether, ASF400"), 9,9-bis(4-methacryloyloxyphenyl)fluorene (produced by Nippon Steel Chemical Co., Ltd., "bisphenolfluorene dimethacrylate"), 9,9-bis(4-acryloyloxyphenyl)fluorene, 9,9-bis[4-(2-acryloyloxyethoxy)phenyl]fluorene (produced by Osaka Gas Co., Ltd., "bisphenoxyethanolfluorene diacrylate, BPEF-A"), 9,9-bis[4-(2-methacryloyloxyethoxy)phenyl]fluorene (produced by Osaka Gas Co., Ltd., "bisphenoxyethanolfluorene dimethacrylate, BPEF-MA"), 9,9-bis[4-[2-(3-acryloyloxy-2-hydroxy-propoxy)-ethoxy]phenyl]fluorene (produced by Osaka Gas Co., Ltd., "bisphenoxyethanolfluorene diepoxyacrylate, BPEF-GA") and 9,9-bis[4-(3-acryloyloxy-2-hydroxy)propoxy-3-methylphenyl]fluorene (produced by Osaka Gas Co., Ltd., "biscresolfluorene diepoxyacrylate, BCF-GA").

Examples of more preferred compounds are
9,9-bis[4-(3-acryloyloxy-2-hydroxy)propoxyphenyl]fluorene,
9,9-bis(4-methacryloyloxyphenyl)fluorene,
9,9-bis(4-acryloyloxyphenyl)fluorene,
9,9-bis[4-(2-acryloyloxyethoxy)phenyl]fluorene and
9,9-bis[4-(2-methacryloyloxyethoxy)phenyl]fluorene.

The plasticizers (C) to be used in the present invention are compounds which are unreactive with the thermoplastic resins (A) and the radical polymerizable compounds (B). Examples of plasticizers (C) are inactive compounds such as phthalates represented by dimethyl phthalate, diethyl phthalate and dioctyl phthalate; aliphatic dibasic acid esters represented by dimethyl adipate, dibutyl adipate, dimethyl sebacate, diethyl sebacate, dibutyl sebacate and diethyl succinate; orthophosphates represented by trimethyl phosphate, triethyl phosphate, triphenyl phosphate and tricresyl phosphate; acetates represented by glyceryl triacetate and 2-ethylhexyl acetate; and phosphites represented by triphenyl phosphite and dibutylhydrodiene phosphite.

Alkylene glycol alkyl ethers represented by the following general formula [III] can also be used, wherein $R^{11}$ and $R^{12}$, the same or different, are alkyl having one to five carbon atoms, hydroxyl or acetyl, and "n" is an integer of 1 to 5.

Typical examples of alkylene glycol alkyl ethers are ethylene glycol dimethyl ether, ethylene glycol diethyl ether, ethylene glycol dipropyl ether, ethylene glycol monomethyl ether, ethylene glycol monoethyl ether, ethylene glycol monopropyl ether, diethylene glycol dimethyl ether, diethylene glycol diethyl ether, diethylene glycol dipropyl ether, diethylene glycol monomethyl ether, diethylene glycol monoethyl ether, diethylene glycol monopropyl ether, triethylene glycol dimethyl ether, triethylene glycol diethyl ether, triethylene glycol dipropyl ether, triethylene glycol monomethyl ether, triethylene glycol monoethyl ether, triethylene glycol monopropyl ether, cellosolve acetate ethylene glycol diacetyl ether, ethylene glycol monoacetyl ether, diethylene glycol diacetyl ether, diethylene glycol monoacetyl ether, triethylene glycol diacetyl ether and triethylene glycol monoacetyl ether.

It is also possible to use polyethylene glycol having a weight-average molecular weight of 10,000 or lower or silicone oil.

It is preferable to select a plasticizer (C) having a refractive index being much smaller than those of the thermoplastic resins (A).

The above-mentioned exemplified compounds can be used solely or in combination.

When the weight percentage ratio of the thermoplastic resin (A), the radical polymerizable compound (B) and the plasticizer (C), (A):(B):(C) is 10 to 80:10 to 80:10 to 80, the hologram recording material compositions according to the present invention are excellent in transparency and diffraction efficiency. When the ratio of (A), (B) and (C) does not fall in this range, holograms cannot be recorded, or the diffraction efficiency falls. The weight percentage ratio, (A):(B):(C) is preferably 20 to 70:10 to 60:20 to 70, more preferably 30 to 60:15 to 45:25 to 55.

These components are selected in the hologram recording material compositions according to the present invention so that the refractive index of the radical polymerizable compound (B) is as larger as possible, preferably larger by 0.005 or more than the weighted mean of that of the thermoplastic resin (A) and that of the plasticizer (C). When the refractive index of the radical polymerizable compound (B) is smaller than the weighted mean of that of the thermoplastic resin (A) and that of the plasticizer (C), the holograms sometimes cannot be recorded, or the diffraction efficiency falls.

As the photo-polymerization initiator (D) used in the present invention, there can suitably be used those forming a radical by absorbing laser light, such as He—Ne laser (wavelength: 633 nm), Ar laser (wavelength: 515 and 488 nm), YAG laser (wavelength: 532 nm) and He—Cd laser (wavelength: 442 nm) as light sources. As the photo-polymerization initiator, for example, there can preferably be used a carbonyl compound, an amine compound, an arylaminoacetic acid compound, an organotin compound, an alkylarylborate, an onium salt, an iron arene complex, a trihalogenomethyl-substituted triazine compound, an organic peroxide, a bisimidazole derivative, a titanocene compound and combinations of these initiators and a photosensitizing dye.

Examples of carbonyl compounds include benzil, benzoin ethyl ether, benzophenone and diethoxyacetophenone.

Examples of amine compounds are triethanolamine, triisopropanolamine and 2-dimethylaminobenzoic acid.

An example of arylaminoacetic acid compounds is N-phenylglycine.

An example of organotin compounds is tributylbenzyltin.

Examples of alkylarylborates are tetrabutylammonium triphenylbutylborate and triphenyl-n-butylborate.

An example of onium salts is a diphenyliodonium salt.

An example of iron arene complexes is $\eta^5$-cyclopentadienyl-$\eta^6$-cumenyl-iron (1+)-hexafluorophosphate (1−).

An example of trihalogenomethyl-substituted triazine compounds is tris(trichloromethyl)triazine.

An example of organic peroxides is 3,3',4,4'-tetra(tert-butylperoxycarbonyl)benzophenone.

Examples of bisimidazole derivatives are 2,2'-bis(o-chlorophenyl)-4,4',5,5'-tetraphenyl-1,1'-biimidazole and bis(2,4,5-triphenyl)imidazolyl.

An example of titanocene compounds is bis($\eta^5$-2,4-cyclopentadien-1-yl)-bis(2,6-difluoro-3-(1H-pyrrol-1-yl)phenyl)titanium.

These can be used solely or in combination.

As the photosensitizing dye, Michler's ketone, Acridine Yellow, merocyanine, methylene blue, camphorquinone, Eosin and decarboxylated rose bengal are preferably used. Any photosensitizing dye can be used as far as it exhibits absorption in the visible region, and in addition to the above, a cyanine derivative, a merocyanine derivative, a phthalocyanine derivative, a xanthene derivative, a thioxanthene derivative, an acridine derivative, a porphyrin derivative, a coumarin derivative, a basestyryl derivative, a ketocoumarin derivative, a quinolone derivative, a stilbene derivative, an oxazine derivative and a thiazine dye can be used. Furthermore, photo-sensitizing dyes described in *Dye Handbook,* edited by S. Ohgawara, et al. (Kodansha, 1986), *Chemistry of Functional Dyes,* edited by S. Ohgawara, et al. (CMC, 1983), and *Special Functional Materials,* edited by C. Ikemori, et al. (CMC, 1986) can be used. These can be used singly or in combination of two or more.

Examples of coumarin derivatives are
3-(2-benzothiazolyl)-7-(diethylamino)coumarin,
3-(2-benzothiazolyl)-7-(dibutylamino)coumarin,
3-(2-benzothiazolyl)-7-(dioctylamino)coumarin and
3-(2-benzimidazolyl)-7-(diethylamino)coumarin.

Examples of ketocoumarin derivatives are
3,3'-carbonylbis(7-diethylaminocoumarin),
3,3'-carbonylbis-7-diethylaminocoumarin-7'-bis(butoxyethyl)-aminocoumarin and 3,3'-carbonylbis(7-dibutylaminocoumarin).

Examples of basestyryl derivatives are
2-[p-(dimethylamino)styryl]benzothiazole,
2-[p-(dimethylamino)styryl]naphtho[1,2-d]thiazole and
2-[(m-hydroxy-p-methoxy)styryl]benzothiazole.

Examples of merocyanine derivatives are 3-ethyl-5-[(3-ethyl-2(3H)-benzothiazolylidene)ethylidene]-2-thioxo-4-oxazolidinone and 5-[(1,3-dihydro-1,3,3-trimethyl-2H-indol-2-ylidene)ethylidene]-3-ethyl-2-thioxo-4-oxazolidinone.

Specific examples of combinations of the organic peroxide and the photosensitizing dye include combinations of 3,3',4,4'-tetra(tert-butylperoxycarbonyl)benzophenone and NKX653, NKX3883, NKX1880, NKX1595, NKX1695, NK4256, NK1886, NK1473, NK1474, NK4795, NK4276, NK4278, NK91, NK1046, NK1237, NK1420, NK1538, NK3590 and the like, which are photosensitizing dyes produced by Nippon Photosensitizing Dye Laboratory Co., Ltd.

Combinations of "B-CIM" produced by Hodogaya Chemical Co., Ltd. as a bisimidazole derivative, chain-transfer agents such as 2-mercaptobenzoxazole and 2-mercaptobenzothiazole and the above-mentioned photosensitizing dyes can also be suitably used.

Specific examples of combinations of the carbonyl compound and the photosensitizing dye include benzil-Michler's ketone, and benzil-Acridine Yellow. As the photosensitizing dye used in combination with the amine compound, decarboxylated rose bengal is preferred. As the photosensitizing dye used in combination with the borate compound, a cyanine-based dye, such as a cyanine, an isocyanine and a pseudocyanine.

The amount of the photo-polymerization initiator (D) added to the composition of the invention is generally about from 0.1 to 15% by weight, and preferably about from 0.3 to 10% by weight, based on 100 parts by weight of the total amount of the thermoplastic resin (A), the radical polymerizable compound (B) and the plasticizer (C) in the case where the carbonyl compound is used.

The hologram recording material composition of the invention can contain additives, such as a thickener, a compatibility adjusting agent, a heat polymerization inhibitor and a chain transfer agent, and a solvent, if necessary.

Inorganic fine particles and organic fine particles can be used as the thickener. Examples of inorganic fine particles include silica gel fine particles "Daiso gel SP series" produced by Daiso Co., Ltd., "Silicia" and "Fuji silica gel" produced by Fuji Silicia Chemical Co., Ltd., "Carplex" produced by Shionogi & Co., Ltd., "Aerosil" produced by Nippon Aerosil Co., Ltd., "Reorosil", "Tokusil" and "Finesil" produced by Tokuyama Co., Ltd. and the like. Examples of organic fine particles include a diallyl phthalate-based polymer which can be obtained by methods described in JP-A 10-72510 and JP-A 10-310684; and "PB 200 series" produced by Kao Corporation, "Bell Pearl series" produced by Kanebo Ltd., "Techpolymer series" produced by Sekisui Plastics Co., Ltd., "Micropearl series" produced by Sekisui Fine Chemical Co., Ltd., and "MR series" and "MP series" both produced by Soken Chemical & Engineering Co., Ltd., which are described in "Most advanced technology of microfine particles", edited by S. Muroi (CMC, 1991). A particle diameter of these fine particles can be smaller than film thickness of the hologram and is preferably 0.1 to 20 nm. The amount of the plasticizer added is preferably about from 0.5 to 30 parts by weight per 100 parts by weight of the total amount of the thermoplastic resin (A), the radical polymerizable compound (B) and the plasticizer (C).

The organic solvent is effective to improve the film forming property, as well as the viscosity adjustment and the compatibility adjustment. For example, acetone, xylene, toluene, methyl ethyl ketone, tetrahydrofuran, benzene, methylene chloride, dichloromethane, chloroform, methanol and the like are usually used. However, water cannot be used since water inhibits the viscosity adjustment, the compatibility adjustment, the film forming property and the like. Water cannot be used as a medium even in the form of emulsion. The amount of the solvent used is about from 0.5 to 1,000 parts by weight per 100 parts by weight of the total amount of the thermoplastic resin (A), the radical polymerizable compound (B) and the plasticizer (C).

Examples of heat polymerization inhibitors include hydroquinone, p-methoxyphenol, tert-butylcatechol, naphthylamine, diphenylpicrylhydrazine, diphenylamine and the like, which work to consuming the forming radicals.

Examples of the chain transfer agent include an α-methylstyrene dimer, 2-mercaptobenzoxazole, 2-mercaptobenzothiazole, tert-butyl alcohol, n-butanol, isobutanol, isopropylbenzene, ethylbenzene, chloroform, methyl ethyl ketone, propylene, vinyl chloride and the like.

In order to prepare the hologram recording material composition, for example, the thermoplastic resin (A), the radical polymerizable compound (B), the plasticizer (C) and the photo-polymerization initiator (D), as well as the optional components described above, the additives and the solvent are placed in a vessel resistant to an organic solvent, such as a glass beaker, and the whole content is stirred. In this case, in order to accelerate dissolution of solid components, the composition can be heated to a range in which denaturation of the composition does not occur, such as to a temperature of about from 40 to 90° C.

In order to produce a hologram recording medium by using the hologram recording material composition of the invention, the recording material composition is coated on one surface of a substrate to obtain a recording medium having a two-layer structure consisting of the coated film thus formed, i.e., a recording layer (photosensitive film for recording), and the substrate. A three-layer structure is obtained, if necessary, by placing a protective material in the form of a film, a sheet or a plate to cover the recording layer formed on the substrate. In the process for preparing the recording layer, an organic solvent is preferably used. In this case, the thermoplastic resin (A), the radical polymerizable compound (B), the plasticizer (C) and the photo-polymerization initiator (D) are dissolved in a solvent, and a solution thus obtained is coated on a substrate. Thereafter, the solvent is vaporized to obtain a recording layer. In the case where a protective material is placed to cover the recording layer, it is preferred that the solvent is removed by air drying, vaporization under reduced pressure or heating before placing the protective material. The substrate is made of an optically transparent material, such as a glass plate and a plastic plate, such as a polyethylene terephthalate (hereinafter abbreviated as PET) plate, a polycarbonate plate and a polymethyl methacrylate plate or a film. The thickness of the substrate is preferably from 0.02 to 10 mm. The protective material is also made of an optically transparent material as similar to the substrate. The substrate does not necessarily have to be flat, but can be bent or curved and can have an uneven structure on the surface thereof. The thickness of the protective material is preferably from 0.02 to 10 mm. Examples of the coating method include a gravure coating method, a roll coating method and a bar coating method. The coating is preferably conducted in such a manner that the thickness of the recording layer after removing the solvent is from 1 to 100 μm.

In order to record an object to be recorded as a hologram onto the hologram recording medium according to the present invention, general recording methods can be used. Namely, light having a wavelength of 200 to 800 nm is split into two, one beam (reference light) and reflected light (object light) obtained from the object to be recorded by irradiating the object with the other beam (or transmitted light (object light) obtained from a volume phase-type master hologram on which information of the object is recorded previously by irradiating the master hologram with the other beam) are made enter from the same face or a front face and a rear face of the recording medium respectively, and they are made interfere. The hologram recording material medium is located at a position where an interference fringe thus obtained can be caught, and the object is recorded on the medium.

In more detail, laser light is split into two beams with a beam splitter or the like, and these beams are mixed again using a mirror or the like to obtain the interference fringe (two light flux exposure method). Alternatively, one laser light is reflected with a mirror, and incident light and reflected light are mixed again to obtain the interference fringe (one light flux exposure method). When an interference pattern is obtained, a hologram prepared separately can be located in a light path as the master hologram, and the interference fringe can be obtained by the one light flux and/or two light flux exposure method. The recording medium is located at a position where intensity distribution of light and shade of the interference pattern thus formed can be caught. Irradiating laser light for about from several seconds to several minutes under such an arrangement, an interference fringe to be a hologram is recorded on the recording medium.

The light amount of the laser light used is, in terms of a product of the light intensity and the irradiation time, preferably about from 1 to 10,000 mJ/cm$^2$. When the light amount is less than the range, recording is difficult to conduct, whereas when it exceeds the range, the diffraction efficiency of the hologram tends to be lowered, and therefore the both cases are not preferred. Light sources to be used in the present invention can be any light sources which bring about polymerization of the radical polymerizable compound (B) accompanied by electron transfer when a photopolymerization initiation system comprising the photo-polymerization initiator (D) or a combination of the photo-polymerization initiator and the photosensitizing dye is irradiated with light generated from the light source. Typical examples of light sources are a high-pressure mercury lamp, an ultrahigh pressure mercury lamp, a low-pressure mercury lamp, a xenon lamp and a metal halide lamp. These light sources can be used when information of the master hologram is copied into the recording medium or the like. These light sources can be used also as light sources when the hologram on which the interference fringe is recorded is fixed. A laser can be used as a preferred light source. Since the laser has a single wavelength and coherence, the laser is a preferred light source in hologram recording. A more preferred light source is one which is excellent in coherence, for example the laser equipped with optics such as etalon or the like, and has a frequency of the single wavelength adjusted to a single frequency. Typical lasers have an oscillating wavelength of 200 to 800 nm, and specific examples thereof are Kr laser (wavelength: 647 nm), He—Ne laser (wavelength: 633 nm), Ar laser (wavelength: 514.5 and 488 nm), YAG laser (wavelength: 532 nm) and He—Cd laser (wavelength: 442 nm). These light sources can be used solely or in combination. The light sources can be continuous light, or pulse oscillation of the light sources can be performed at constant or optional intervals. The recording material can be irradiated with light obtained from the light sources before or after recording besides in recording.

After forming the hologram, a post-processing, such as development and fixing, is not always necessary, but in order to stabilize the resulting image, the medium can be subjected to a irradiation treatment with light on the whole surface thereof or a heat treatment to post-polymerize the remaining unreacted monomer.

In the recording material composition of the invention, the thermoplastic resin (A), the radical polymerizable compound (B), the plasticizer (C) and the photo-polymerization initiator (D) are completely dissolved each other before exposure to light, and on irradiation with laser light, the radical polymerizable compound (B) is polymerized through photo-polymerization, and finally becomes a hologram recording layer.

Accordingly, when the two-layer structure, which comprises a substrate having the recording material composition coated thereon, or the three-layer structure, which comprises the two-layer structure having a protective layer formed on the recording layer, is exposed to an interference fringe having intensity distribution of light and shade, photo-polymerization of the radical polymerizable compound (B) having a high photo-polymerization reactivity begins to occur at a portion of a large light amount, and volume shrinkage occurs at that portion. An unreacted compound flows from a portion of a small light amount into a concave portion formed by the volume shrinkage, and the thermoplastic resin (A) diffuses into the portion of a small light amount by phase separation between the thermoplastic resin (A) and the radical polymerizable compound (B). The radical polymerizable compound (B) is diffused to migrate into the portion of a large light amount to further proceed the photo-polymerization. As a result, a structure wherein the polymer of the radical polymerizable compound (B) having a high refractive index is accumulated in the portion of a large light amount, the thermoplastic resin (A) having a low refractive index is accumulated in the portion of a small light amount is formed.

The plasticizer (C) is a component to adjust viscosity and compatibility of the system and functions as a component to promote the separation between the thermoplastic resin (A) and the radical polymerizable compound (B). This agent exists uniformly in the system in the early stage of the exposure to light but is finally excluded into the portion of a small light amount, namely to the thermoplastic resin (A) side. Accordingly, a compositional distribution corresponding to an amount of light, i.e., the interference fringe due to a difference in refractive index between a portion having large amounts of the thermoplastic resin (A) and the plasticizer (C) and a portion having a large amount of the radical polymerizable compound (B) is formed as a hologram.

The object to be recorded can be recorded and reproduced by using the volume phase-type hologram recording medium according to the present invention. Since a usual photograph can record only information of amplitude of an object, the object recorded on the photograph can be seen only as two dimensions. On the other hand, since the recording medium can record information of a phase and amplitude of an object at the same time, namely can record completely three dimensional information, the recorded object can also be seen as completely three dimensions. Records by the two light flux exposure method are described in Examples of the present invention, and the object to be recorded is mirror surface in this case. The object light and the reference light can be made enter from the same face or the front face and the rear face on the recording face of the recording medium, and they can be made interfere in order to obtain the interference fringe. A transmission type hologram is recorded in the former case, and a reflection type hologram is recorded in the latter case. The mirror surface is an object to be recorded also in the one light flux exposure method, but another object to be recorded is used instead of the mirror, light having coherence such as laser light is used as the light source, the recording medium is located at a position where the interference fringe formed by interference between incident light (reference light) and reflected light from the object or transmitted light (object light) can be caught, and the object can be recorded on the medium. When the records are reproduced, white light and the light source to be used in recording can be used as the reference light, and preferably the object light is efficiently reproduced by irradiating the latter light source at the same angle as that of the reference light in recording the hologram. A volume phase-type hologram on which the information of the object is recorded previously can be used in order to obtain the object light. In this method, the recorded hologram is used as the master hologram, and the information of the hologram can be copied by the one light flux exposure method. In this case, it is possible to record the interference fringe formed by interference between the reference light (transmitted light (containing no information of the object) from the master hologram) and the object light (transmitted light (containing the information of the object) diffracted from the master hologram) by the one light flux exposure method. This method has the advantage that it is easy to perform mass production. Diffraction efficiency evaluated in Examples of the present invention is a proportion(%) of intensity of the object light to intensity of the reference light, and the former expresses brightness of the reproduced light in mirror surface. That is, the diffraction efficiency is an index showing how brightly the object can be recorded and reproduced.

BEST MODE FOR CARRYING OUT THE INVENTION

The invention will be specifically described with reference to several examples, but the invention is not construed as being limited thereto.

EXAMPLE 1

1) Polyvinyl acetate ("vinyl acetate polymer methanol solution" produced by Wako Pure Chemical Co., Ltd., degree of polymerization: 1,400 to 1,600, refractive index of polymer: 1.46) was heated to remove methanol. 4.2 g of the remaining polymer as a thermoplastic resin (A), 1.6 g of an acrylic acid adduct of 9,9-bis(4-hydroxyphenyl)fluorene glycidyl ether ("ASF400" produced by Nippon Steel Chemical Co., Ltd., refractive index of simple substance: 1.63) as a radical polymerizable compound (B) having a 9,9-diarylfluorene skeleton and being solid at an ordinary temperature and at ordinary pressure, 4.2 g of diethyl sebacate ("SDE" produced by Wako Pure Chemical Co., Ltd., refractive index: 1.43) as a plasticizer (C), 1.5 g of 3,3',4,4'-tetra (tert-butylperoxycarbonyl)benzophenone ("BTTB-25" produced by NOF Corporation) as a initiator (D), 0.01 g of a cyanine-based dye ("NK1538" produced by Nippon Photosensitizing Dye Co., Ltd.) as a photosensitizing dye and 11 g of acetone as a solvent were mixed at an ordinary temperature to prepare a recording material composition.

2) The composition was coated by a spin coat method on one surface of a glass plate substrate having a dimension of 60 mm×60 mm to a thickness of 15 to 20 μm after drying. The solvent was removed from the coated layer by heat treatment, to produce a recording medium having a two-layer structure comprising the substrate and the recording layer.

3) A PET film having a thickness of 50 μm was placed to cover the recording layer of this recording medium, to produce a three-layer photosensitive plate for recording a hologram.

4) An Ar ion laser of 514.5 nm was split with a beam splitter, angles of each light were changed with a mirror, and both were recomposed to form interference to obtain an interference fringe. The photosensitive plate was placed at a position where this interference fringe could be caught.

Figure 1:
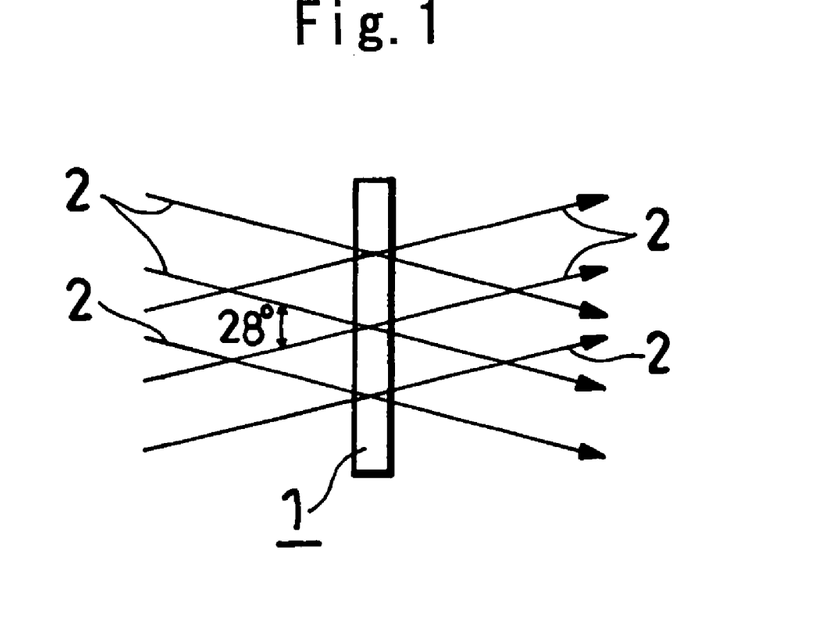
FIG. 1 is a schematic drawing showing an example of a transmission type hologram.
Figure 2:
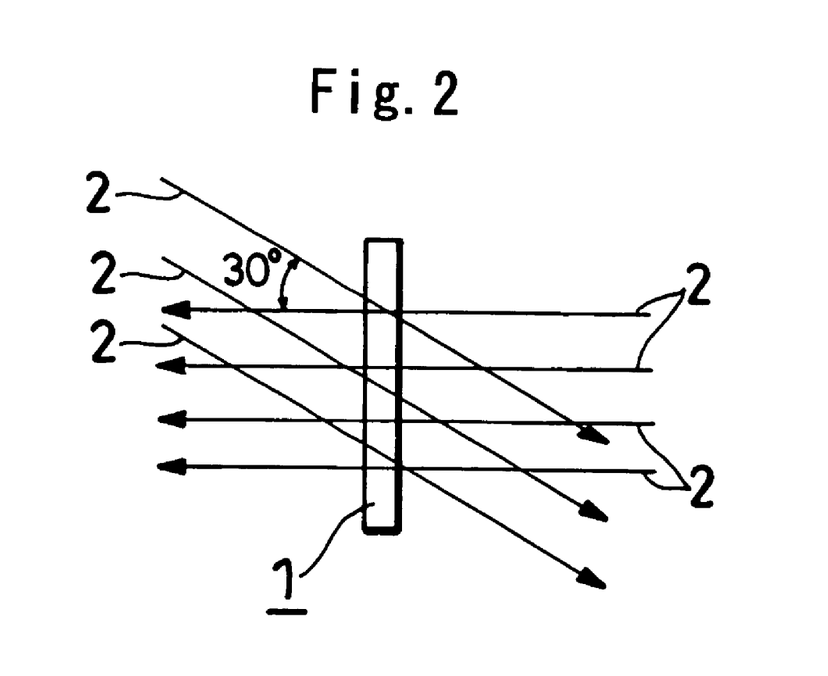
FIG. 2 is a schematic drawing showing an example of a reflection type hologram.

5) FIGS. 1 and 2 show examples of a transmission type hologram and a reflection type hologram respectively. In the figures, (A) is a laser emitter, (BS) is a beam splitter, (M) is the mirror, (S) is the photosensitive plate, (B1) is object light and (B2) is reference light.

6) The photosensitive plate was exposed to light under the conditions, and the interference fringe to be the hologram was recorded on the photosensitive plate.

This exposure to light of the transmission type hologram and the reflection type hologram was carried out using a light intensity on the photosensitive plate of 1.0 mW/cm$^2$ for 0.5 to 100 seconds at an exposed amount of 1 to 200 mJ/cm$^2$.

EXAMPLES 2 TO 4

The amounts of the thermoplastic resin (A), the radical polymerizable compound (B) and the plasticizer (C) were changed as shown in Table 1 in the formulation composition in Example 1. The same operations as in Example 1 were performed with regard to other points.

EXAMPLES 5 TO 7

Polymethyl methacrylate (produced by Wako Pure Chemical Co., Ltd., refractive index of polymer: 1.49), cellulose acetate butyrate (produced by Kanto Chemical Industry Co., Ltd., refractive index of polymer: 1.45) and polyvinyl butyrate ("Polyvinyl butyral 1000" produced by Wako Pure Chemical Co., Ltd., refractive index of polymer: 1.45) were used respectively in the amounts shown in Table 1 instead of polyvinyl acetate as the thermoplastic resin (A) in the formulation composition in Example 1. The same operations as in Example 1 were performed with regard to other points.

EXAMPLE 8

1) An isobornylmethacrylate monomer ("Light ester IB-X" produced by Kyoeisha Chemical Co., Ltd.) was prepared as cyclic aliphatic methacrylate obtained by esterification of cyclic aliphatic alcohol with methacrylic acid, which is one of raw monomers of the thermoplastic resin (A). The isobornylmethacrylate monomer and a methyl methacrylate monomer ("Light ester M" produced by Kyoeisha Chemical Co., Ltd.) were added to two-fold volume of dioxane in a molar ratio of 17:83, the obtained solution was degassed under nitrogen bubbling for two hours, azobisisobutyronitrile was added to the solution as an initiator in an amount of 0.01 mol/l, and a polymerization reaction was performed under reflux at 60° C. The obtained reaction mixture was poured into cold methanol to precipitate a polymer. The obtained polymer was reprecipitated twice using tetrahydrofuran as a good solvent and methanol as a poor solvent to wash it. The obtained copolymer had a molecular weight of 230,000, a glass transition temperature of 158° C. and a refractive index of 1.51.

2) 3.7 g of the above-mentioned copolymer as the thermoplastic resin (A), 1.9 g of the acrylic acid adduct of 9,9-bis(4-hydroxyphenyl)fluorene glycidyl ether as the radical polymerizable compound (B), 4.4 g of diethyl sebacate as the plasticizer (C), 0.82 g of 2,2'-bis(o-chlorophenyl)-4, 4',5,5'-tetraphenyl-1,1'-'biimidazole ("B-CIM" produced by Hodogaya Chemical Co., Ltd.) as the photo-polymerization initiator (D), 0.01 g of a cyanine-based dye ("NK1538" produced by Nippon Photosensitizing Dye Co., Ltd.) as a photosensitizing dye, 0.373 g of mercaptobenzoxazole as a chain-transfer agent and 14 g of acetone as the solvent were mixed at an ordinary temperature to prepare a recording material composition. The same operations as in Example 1 were performed with regard to other points.

A refractive index of the thermoplastic resin (A) is 1.51, a refractive index of the radical polymerizable compound (B) is 1.63, a refractive index of the plasticizer (C) is 1.43, and a weight ratio of the thermoplastic resin (A) to the plasticizer (C) is 3.7:4.4. Accordingly, a weighted mean of the refractive index of the thermoplastic resin (A) and the refractive index of the plasticizer (C) is 1.47. The refractive index of the radical polymerizable compound (B) is larger than the weighted mean of the refractive index of the thermoplastic resin (A) and the refractive index of the plasticizer (C), and its difference is 0.2.

EXAMPLE 9

The molar ratio of the isobornylmethacrylate monomer to the methyl methacrylate monomer was changed into 25:75 in the step 1) of Example 8. The same operations as in Example 1 were performed with regard to other points.

A refractive index of the thermoplastic resin (A) is 1.50, and a weighted mean of the refractive index of the thermoplastic resin (A) and the refractive index of the plasticizer (C) is 1.46. The refractive index of the radical polymerizable compound (B) is larger than the weighted mean of the refractive index of the thermoplastic resin (A) and the refractive index of the plasticizer (C), and its difference is 0.17.

EXAMPLE 10

The amount of the copolymer as the thermoplastic resin (A) was changed into 3.3 g, and the amount of the radical polymerizable compound (B) was changed into 2.3 g respectively in the composition of Example 8. The same operations as in Example 1 were performed with regard to other points.

Since the weight ratio of the thermoplastic resin (A) to the plasticizer (C) is 3.3:4.4, the weighted mean of the refractive index of the thermoplastic resin (A) and the refractive index of the plasticizer (C) is 1.46. The refractive index of the radical polymerizable compound (B) is larger than the weighted mean of the refractive index of the thermoplastic resin (A) and the refractive index of the plasticizer (C), and its difference is 0.17.

EXAMPLES 11 TO 13

9,9-Bis[4-(2-methacryloyloxyethoxy)phenyl]fluorene ("bisphenoxyethanolfluorene dimethacrylate, BPEF-MA" produced by Osaka Gas Co., Ltd., refractive index of simple substance: 1.625) as the radical polymerizable compound (B), diethyl adipate (ADE, refractive index: 1.42) and 2-ethoxyethyl acetate (refractive index of simple substance: 1.40) as the plasticizers (C), 2,2'-bis(o-chlorophenyl)-4,4',5,5'-tetraphenyl-1,1'-biimidazole ("B-CIM" produced by Hodogaya Chemical Co., Ltd.) as the initiator (D) and mercaptobenzoxazole as the chain-transfer agent were used respectively in the amounts shown in Table 1. The same operations as in Example 1 were performed with regard to other points.

COMPARATIVE EXAMPLES 1 AND 2

Radical polymerizable compounds (radical polymerizable compounds (B')) other than the radical polymerizable compound (B) were used in the formulation composition of Example 1. As the radical polymerizable compounds (B'), 2-phenoxyethyl acrylate (FA) (Comparative Example 1), which is a radical polymerizable compound having no 9,9-diarylfluorene skeleton and being liquid at an ordinary temperature, and 9,9-bis(3-ethyl-4-acryloxydiethoxyphenyl)fluorene (BPF, refractive index of simple substance: 1.59) (Comparative Example 2), which is a radical polymerizable compound having the 9,9-diarylfluorene skeleton and being liquid at an ordinary temperature, were used respectively in the amounts shown in Table 2. The same operations as in Example 1 were performed with regard to other points. Thus, when the compound which has the 9,9-diarylfluorene skeleton and at least one radical polymerizable unsaturated double bond and is solid at an ordinary temperature and at ordinary pressure is not used as the radical polymerizable compound, the refractive index of the radical polymerizable compound is larger than the weighted mean of the refractive index of the thermoplastic resin (A) and the refractive index of the plasticizer (C), but sufficient diffraction efficiency was not obtained as shown in Table 2.

COMPARATIVE EXAMPLES 3 TO 8

As shown in Table 2, the thermoplastic resin (A), the radical polymerizable compound (B) and the plasticizer (C) were blended in ratios outside the range defined in the present invention. The same operations as in Example 1 were performed with regard to other points. As shown in Table 2, a difference in refractive index of the radical polymerizable compound (B) is larger than the weighted mean of the refractive index of the thermoplastic resin (A) and the refractive index of the plasticizer (C) in these formulations. However, since any one or two component(s) exist(s) in too small or large amount(s), sufficient material transfer does not occur in recording holograms and/or fixing after recording is insufficient. Accordingly, the holograms cannot be recorded, or diffraction efficiency dropped remarkably.

COMPARATIVE EXAMPLE 9

As shown in Table 2, polypentabromophenyl methacrylate (refractive index: 1.71) as the thermoplastic resin (A), 9,9-bis[4-(2-methacryloyloxyethoxy)phenyl]fluorene ("bisphenoxyethanolfluorene dimethacrylate, BPEF-MA" produced by Osaka Gas Co., Ltd., refractive index of simple substance: 1.625), which has the 9,9-diarylfluorene skeleton and at least one radical polymerizable unsaturated double bond and is solid at an ordinary temperature and at ordinary pressure, as the radical polymerizable compound (B) and 2-ethoxyethyl acetate (refractive index of simple substance: 1.40) as the plasticizer (C) were used. The same operations as in Example 1 were performed with regard to other points. Thus, each component and each amount are in the ranges defined in the present invention. However, since a difference in refractive index of the radical polymerizable compound (B) is smaller than the weighted mean of the refractive index of the thermoplastic resin (A) and the refractive index of the plasticizer (C), and there is no sufficient difference in refractive index, diffraction efficiency dropped remarkably.

COMPARATIVE EXAMPLE 10

The photosensitive plate for recording prepared in Example 1 was irradiated with an Ar ion laser of 514.5 nm, a high-pressure mercury lamp ("UM-102", produced by Ushio Electric Co., Ltd.), an ultrahigh pressure mercury lamp ("USH-102D", produced by Ushio Electric Co., Ltd.), a xenon lamp ("UXL-500D-0", produced by Ushio Electric Co., Ltd.) or a metal halide lamp ("UVL-4000M3", produced by Ushio Electric Co., Ltd.) as a light source. A method of recording was neither two light flux exposure nor one light flux exposure, and the photosensitive plate for recording was only irradiated with light. Transmission type and reflection type holograms could not be recorded at all in these experiments. Namely, even if a hologram is tried to record using laser light or light containing ultraviolet radiation (the above-mentioned high-pressure mercury lamp or the like), the hologram cannot be recorded unless light is made interfere.

COMPARATIVE EXAMPLE 11

Two light flux exposure and one light flux exposure were performed on the photosensitive plates for recording prepared in Example 1 using the high-pressure mercury lamp ("UM-102", produced by Ushio Electric Co., Ltd.), the ultrahigh pressure mercury lamp ("USH-102D", produced by Ushio Electric Co., Ltd.), the xenon lamp ("UXL-500D-0", produced by Ushio Electric Co., Ltd.) or the metal halide lamp ("UVL-4000M3", produced by Ushio Electric Co., Ltd.) instead of the Ar ion laser of 514.5 nm as the light source. An object to be recorded is a mirror in all cases. Transmission type and reflection type holograms could not be recorded at all in these experiments. Namely, even if light containing ultraviolet radiation is used and light is made interfere, a hologram cannot be recorded by the two light flux exposure method and the one light flux exposure method unless coherence of light from the light source is good.

EXAMPLE 14

One light flux exposure was performed on the photosensitive plate for recording prepared in Example 1 using the high-pressure mercury lamp ("UM-102", produced by Ushio Electric Co., Ltd.), the ultrahigh pressure mercury lamp ("USH-102D", produced by Ushio Electric Co., Ltd.), the xenon lamp ("UXL-500D-0", produced by Ushio Electric Co., Ltd.) or the metal halide lamp ("UVL-4000M3", produced by Ushio Electric Co., Ltd.) as the light source. An object to be recorded is a transmission type hologram (diffraction efficiency: 75%, resolution: about 500/mm) prepared separately. The transmission type hologram was glued on the photosensitive plate for recording and irradiated. In this case, object light is light diffracted by the transmission type hologram, and reference light is light penetrating the transmission type hologram without being diffracted. The hologram could be recorded, and diffraction efficiency was high, i.e., 90% or higher in all cases. Thus, recording can be made by copying a master hologram using light containing ultraviolet radiation, too.

Evaluation of Performance

Each film thickness and diffraction efficiency of each hologram after recording were measured for the holograms obtained in the above-mentioned Examples and Comparative Examples.

a) Film Thickness

The film thickness of each hologram after recording was measured with a micrometer.

b) Diffraction Efficiency

The diffraction efficiency of each transmission type hologram was calculated by determining a ratio of diffracted light to incident light with a light power meter (OPTICAL POWER/ENERGYMETER, MODEL 66XLA produced by PHOTODYNE Co., Ltd.) by the following equation.

Diffraction efficiency (%)=(diffracted light intensity/incident light intensity)×100 c) The Diffraction Efficiency of the Reflection Type Hologram was Determined by Measuring Transmittance with an Ultraviolet Spectrophotometer ("V-550" Produced by Nippon Spectroscopy Co., Ltd.).

d) Glass Transition Temperature

Each glass transition temperature of each hologram after recording was measured with a dynamic viscoelastic properties measuring device.

Examples 1 to 13 and their evaluation results are summarized in Table 1, and Comparative Examples 1 to 9 and their evaluation results are summarized in Table 2.

TABLE 1

| | Example | | | | | | | | | | | | | (g) |
|---|---|---|---|---|---|---|---|---|---|---|---|---|---|---|
| | 1 | 2 | 3 | 4 | 5 | 6 | 7 | 8 | 9 | 10 | 11 | 12 | 13 | |
| Thermoplastic resin (A) | | | | | | | | | | | | | | |
| Polyvinyl acetate | 4.2 | 2 | 2.5 | 6.5 | | | | | | | 3.4 | 3.4 | 3.4 | |
| Polymethyl methacrylate | | | | | 4.2 | | | | | | | | | |
| Cellulose acetate butyrate | | | | | | 4.2 | | | | | | | | |
| Polyvinyl butyral | | | | | | | 5 | | | | | | | |
| Copolymer | | | | | | | | 3.7 | 3.7 | 3.3 | | | | |
| (Molar ratio of isobornyl methacrylate to methyl methacrylate) | | | | | | | | (17:83) | (25:75) | (17:83) | | | | |
| Radical polymerizable compound (B) | | | | | | | | | | | | | | |
| ASF400 | 1.6 | 5.5 | 1 | 1 | 1.6 | 1.6 | 2 | 1.9 | 1.9 | 2.3 | | | | |
| BPEF-MA | | | | | | | | | | | 2.6 | 2.6 | 2.6 | |
| Plasticizer (C) | | | | | | | | | | | | | | |
| Diethyl sebacate | 4.2 | 2.5 | 6.5 | 2.5 | 4.2 | 4.2 | 3 | 4.4 | 4.4 | 4.4 | | | | |
| Diethyl adipate | | | | | | | | | | | 4 | | 4 | |
| 2-Ethoxyethyl acetate | | | | | | | | | | | | 4 | | |
| Photopolymerization initiator (D) | | | | | | | | | | | | | | |
| BTTB-25 | 1.5 | 1.5 | 1.5 | 1.5 | 1.5 | 1.5 | 1.5 | | | | | | | |
| B-CIM | | | | | | | | 0.82 | 0.82 | 0.82 | 0.89 | 0.89 | 0.89 | |
| Photosensitizing dye | | | | | | | | | | | | | | |
| Cyanine-based dye NK-1538 | 0.01 | 0.01 | 0.01 | 0.01 | 0.01 | 0.01 | 0.02 | 0.01 | 0.01 | 0.01 | | | | |
| Cyanine-based dye NK-1420 | | | | | | | | | | | 0.02 | 0.02 | 0.02 | |

TABLE 1-continued

| | Example (g) | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Chain-transfer agent | | | | | | | | | | | | | |
| Mercaptobenzoxazole | | | | | | | | 0.373 | 0.373 | 0.373 | 0.45 | 0.45 | 0.45 |
| Solvent | | | | | | | | | | | | | |
| Acetone | 11 | 11 | 11 | 11 | 11 | 11 | 11 | 14 | 14 | 14 | 14 | 14 | 14 |
| Ethanol | | | | | | | 4 | | | | | | |
| Difference in refractive index | 0.19 | 0.18 | 0.19 | 0.18 | 0.17 | 0.17 | 0.18 | 0.2 | 0.17 | 0.17 | 0.19 | 0.18 | 0.17 |
| Film thickness (μm) | 17 | 18 | 17 | 16 | 17 | 17 | 15 | 16 | 17 | 16 | 15 | 16 | 16 |
| Diffraction efficiency (%) (reflection type hologram) | 94 | 91 | 94 | 92 | 97 | 96 | 96 | 97 | 96 | 95 | 96 | 94 | 95 |
| Diffraction efficiency (%) (transmission type hologram) | 95 | 92 | 98 | 94 | 97 | 99 | 89 | 96 | 95 | 96 | 98 | 96 | 97 |
| Transmittance of hologram after recording (%) | 91 | 89 | 90 | 91 | 88 | 87 | 91 | 91 | 91 | 92 | 92 | 92 | 91 |
| Glass transition temperature (° C.) | | | | | | | | 115 | 123 | 120 | 49 | | |

TABLE 2

| | Comparative Example (g) | | | | | | | | |
|---|---|---|---|---|---|---|---|---|---|
| | 1 | 2 | 3 | 4 | 5 | 6 | 7 | 8 | 9 |
| Thermoplastic resin (A) | | | | | | | | | |
| Polyvinyl acetate | 4.2 | 4.2 | 0.5 | 4.5 | 4.5 | 0.5 | 0.5 | 9 | |
| Polypentabromophenyl methacrylate | | | | | | | | | 6 |
| Radical polymerizable compound (B) | | | | | | | | | |
| ASF400 | | | 4.5 | 0.5 | 5 | 0.5 | 9 | 0.5 | |
| BPEF-MA | | | | | | | | | 2 |
| Radical polymerizable compound (B') | | | | | | | | | |
| FA | 1.6 | | | | | | | | |
| BPF | | 1.6 | | | | | | | |
| Plasticizer (C) | | | | | | | | | |
| Diethyl sebacate | 4.2 | 4.2 | 5 | 5 | 0.5 | 9 | 0.5 | 0.5 | |
| 2-Ethoxyethyl acetate | | | | | | | | | 2 |
| Photopolymerization initiator (D) | | | | | | | | | |
| BTTB-25 | 1.5 | 1.5 | 1.5 | 1.5 | 1.5 | 1.5 | 1.5 | 1.5 | 1.5 |
| Photosensitizing dye | | | | | | | | | |
| Cyanine-based dye NK-1538 | 0.01 | 0.01 | 0.01 | 0.01 | 0.01 | 0.01 | 0.01 | 0.01 | 0.01 |
| Chain-transfer agent | | | | | | | | | |
| Mercaptobenzoxazole | | | | | | | | | |
| Solvent | 11 | 11 | 11 | 11 | 11 | 11 | 11 | 11 | 11 |
| Acetone | | | | | | | | | |
| Difference in refractive index | 0.14 | 0.15 | 0.2 | 0.19 | 0.17 | 0.2 | 0.18 | 0.17 | −0.01 |
| Film thickness (μm) | 18 | 17 | 16 | 16 | 15 | 16 | 14 | 15 | 15 |
| Diffraction efficiency (%) (reflection type hologram) | 67 | 64 | 29 | 26 | 15 | 0 | 8 | 4 | 3 |
| Diffraction efficiency (%) (transmission type hologram) | 78 | 70 | 30 | 30 | 22 | 0 | 12 | 7 | 2 |
| Transmittance of hologram after recording (%) | 68 | 83 | 81 | 89 | 88 | 89 | 91 | 90 | 91 |

In the tables,

ASF400: Acrylic acid adduct of 9,9-bis(4-hydroxyphenyl)fluorene glycidyl ether (produced by Nippon Steel Chemical Co., Ltd.)

FA: 2-Phenoxyethyl acrylate

BPF: 9,9-Bis(3-ethyl-4-acryloxydiethoxyphenyl)fluorene

BTTB-25: 3,3+,4,4'-Tetra(tert-butylperoxycarbonyl)benzophenone (produced by NOF Corporation)

BPEF-MA: 9,9-Bis[4-(2-methacryloyloxyethoxy)phenyl]fluorene (produced by Osaka Gas Co., Ltd.)

B-CIM: 2,2'-Bis(o-chlorophenyl)-4,4',5,5'-tetraphenyl-1,1'-biimidazole (produced by Hodogaya Chemical Co., Ltd.)

Difference in refractive index: [Refractive index of radical polymerizable compound (B)]−[Weighted mean of refractive index of thermoplastic resin (A) and refractive index of plasticizer (C)]

Table 1 explicitly shows that all the diffraction efficiency and transmission of the transmission type holograms and the reflection type holograms obtained in Examples are high, and the diffraction efficiency is almost saturated at 30 mJ/cm². The holograms suffered no coloring and had a high brightness without conducting development and fixing. The hologram records were formed with only the refractive index modulation, but not unevenness on the recording layer, and highly transparent holograms having substantially no absorption in the visible region were obtained. Further, when the obtained holograms were heated in an oven at 60° to 130° C. for about three minutes to three hours, the diffraction efficiency increased by about 3 to 30% while maintaining high transparency.

All the glass transition temperatures of the holograms obtained in Examples 8 to 10 are 100° C. or higher, and the holograms can withstand use at high temperatures.

On the other hand, the diffraction efficiency and transmission of the transmission type holograms and the reflection type holograms obtained in Comparative Examples are lower than those of the holograms having approximately equal film thickness in Examples, and the diffraction efficiency did not increase even if the holograms were irradiated with light of 500 mJ/cm² or more.

INDUSTRIAL APPLICABILITY

In the present invention, in a composition comprising a thermoplastic resin (A) which is soluble in a solvent, a radical polymerizable compound (B), a plasticizer (C) and a photopolymerization initiator (D), a radical polymerizable compound which is solid at an ordinary temperature and at ordinary pressure and has a 9,9-diarylfluorene skeleton and at least one radical polymerizable unsaturated double bond is used, and each component is selected so that a refractive index of the radical polymerizable compound (B) is larger than a weighted mean of that of the thermoplastic resin (A) and that of the plasticizer (C). Accordingly, a hologram which can record an image with high transparency and at high diffraction efficiency can be prepared using the hologram recording material composition of the present invention. Since the hologram recording material composition according to the present invention is excellent in film forming property and in a solid state after forming a film, too, a heat treatment for solidifying a flowable composition is not necessary. Further, even if a heat treatment for amplifying diffraction efficiency after recording the hologram is not performed, the composition exhibits sufficiently high diffraction efficiency. Therefore, the composition of the invention can simplify the film formation operation and post-treatment in producing a hologram recording medium, and thus exhibits good workability.

Furthermore, the recording material after recording the hologram has the high transparency. Since the thermoplastic resin (A) and the radical polymerizable compound (B) are present in the form of the polymer having the sufficient high molecular weight by only one exposure to light, it is free of the problem in that the record becomes unclear due to the re-diffusion of them. The recording material is also excellent in long-term heat resistance, weather resistance, solvent resistance and the like. Therefore, the operation of development or fixing for stabilizing the recorded image is not necessary, and thus the hologram can be recorded by the real-time operation.

Further, when a copolymer of cyclic aliphatic methacrylate and methyl methacrylate is used as the thermoplastic resin (A) which is soluble in the solvent, a glass transition temperature of the copolymer is high. Accordingly, a hologram after recording hardly softens under a high-temperature environment, too, and a hologram which is more excellent in heat resistance can be prepared.

The invention claimed is:

1. A volume phase-type hologram recording material composition to be used for recording intensity distribution of light and shade of an interference fringe obtained by making light interfere as a change in refractive index, characterized in that the composition comprises
a thermoplastic resin (A) which is soluble in an organic solvent,
a radical polymerizable compound (B) which is solid at an ordinary temperature and at ordinary pressure and has a 9,9-diarylfluorene skeleton and at least one radical polymerizable unsaturated double bond,
a plasticizer (C) and
a photopolymerization initiator (D),
wherein a weight percentage ratio of the thermoplastic resin (A), the radical polymerizable compound (B) and the plasticizer (C), (A):(B):(C) is 10 to 80:10 to 80:10 to 80, and a weight percentage ratio of the radical polymerizable compound (B) and the plasticizer (C), (B):(C) is 1:1.5 to 1:6.5,
wherein the thermoplastic resin (A) is selected from the group consisting of polyvinyl acetate, polyvinyl butyrate, polymethyl methacrylate, cellulose acetate butyrate, a copolymer of cyclic aliphatic (meth)acrylate and methyl (meth)acrylate and combinations thereof,
wherein the radical polymerizable compound (B) is selected from the group consisting of 9,9-bis[4-(3-acryloyloxy-2-hydroxy)propoxyphenyl]fluorene, 9,9-bis(4-methacryloyloxyphenyl)fluorene, 9,9-bis(4-acryloyloxyphenyl)fluorene, 9,9-bis[4-(2-methacryloyloxyethoxy)phenyl]fluorene, 9,9-bis[4-(2-acryloyloxyethoxy)phenyl]fluorene, 9,9-bis[4-(3-acryloyloxy-2-hydroxy)propoxy-3-methylphenyl]fluorene, 9,9-bis [4-[2-(3-acryloyloxy-2-hydroxypropoxy)-ethoxy]phenyl]fluorene and combinations thereof,
wherein the plasticizers (C) is selected from the group consisting of dimethyl phthalate, diethyl phthalate, dioctyl phthalate, dimethyl adipate, dibutyl adipate, dimethyl sebacate, diethyl sebacate, dibutyl sebacate, diethyl succinate, trimethyl phosphate, triethyl phosphate, triphenyl phosphate, tricresyl phosphate, glyceryl triacetate, 2-ethylhexyl acetate, triphenyl phosphate, dibutylhydrodiene phosphate and combinations thereof, and
wherein a refractive index of the radical polymerizable compound (B) is larger than a weighted mean of that of the thermoplastic resin (A) and that of the plasticizer (C).

2. A hologram recording material composition as claimed in claim 1, wherein the cyclic aliphatic (meth)acrylate constituting the copolymer of cyclic aliphatic (meth)acrylate and methyl (meth)acrylate is methacrylate represented by the following general formula [I], wherein $R^1$ and $R^2$, the same or different, are hydrogen or lower alkyl, "l" is an integer of 0 to 6, "m" is an integer of 2 to 6, "n" is an integer of 1 to 5 which is smaller than "m", any hydrogen atom(s) in alkylene chains $(CH^2)^l$, $(CH^2)^m$ and $(CH^2)^n$ can be substituted by lower alkyl, two hydrogen atoms linked to different carbon atoms in the alkylene chain $(CH^2)^m$ can be substituted by both terminals of another alkylene chain having one to eight carbon atoms to form another cycloalkane ring, any hydrogen atom(s) in the cycloalkane ring can be further substituted by lower alkyl, one of carbon atoms in the alkylene chain $(CH^2)^n$ has hydroxyl, to which (meth)acrylic acid is linked to form an ester linkage, and the broken line (------) is the ester linkage thus formed.

3. A hologram recording material composition as claimed in claim 2, wherein a cyclic aliphatic moiety of the cyclic aliphatic (meth)acrylate constituting the copolymer of cyclic aliphatic (meth)acrylate and methyl (meth)acrylate has a bornyl skeleton, a isobornyl skeleton or a norbornyl skeleton.

4. A hologram recording medium wherein a recording layer comprising the hologram recording material composition as claimed in any one of claims 1, 2, and 3 is formed on a substrate.

5. A process for producing the hologram recording medium as claimed in claim 4, wherein a thermoplastic resin (A), a radical polymerizable compound (B), a plasticizer (C) and a photopolymerization initiator (D) are dissolved in an organic solvent, the obtained solution is applied on a substrate, and then the solvent is volatilized to form a recording layer.

6. A hologram recording material composition as claimed in claim 1, wherein the weight percentage ratio of the thermoplastic resin (A), the radical polymerizable compound (B) and the plasticizer (C), (A):(B):(C) is 30 to 60:15 to 45:25 to 55.

* * * * *